United States Patent [19]

Ewers

[11] Patent Number: 5,331,515
[45] Date of Patent: Jul. 19, 1994

[54] MODULE WITH LEADS FROM MULTIPLE CHIPS SHORTED TOGETHER ONLY AT EDGE CONTACT LOCATIONS

[75] Inventor: Charles R. Ewers, Phoenix, Ariz.

[73] Assignee: SGS-Thomson Microelectronics, Inc., Carrollton, Tex.

[21] Appl. No.: 27,053

[22] Filed: Mar. 5, 1993

Related U.S. Application Data

[62] Division of Ser. No. 761,372, Sep. 18, 1991.

[51] Int. Cl.[5] .............................................. H05K 7/02
[52] U.S. Cl. ..................................... 361/760; 361/748; 361/772; 361/807; 174/261; 257/690; 257/692
[58] Field of Search ............... 361/380, 392, 395, 397, 361/398, 400, 401, 404, 406, 407, 408, 409, 412, 417, 720, 723, 748, 749, 751, 760, 761, 772, 774, 776, 779, 777, 807; 174/255, 257, 258, 260, 261; 257/666, 690, 692, 786

[56] References Cited

U.S. PATENT DOCUMENTS 4,934,045 6/1990 Mase ...................................... 29/854

FOREIGN PATENT DOCUMENTS 60-143639 7/1985 Japan ...................................... 257/666

Primary Examiner—Leo P. Picard
Assistant Examiner—Young Whang
Attorney, Agent, or Firm—Kenneth C. Hill; Robert Groover; Richard K. Robinson

[57] ABSTRACT

A plurality of integrated circuit devices are bonded to a substrate. Signal traces for corresponding pins of the devices are run to the same location, but are not electrically connected. They are, however, located in close physical proximity at a designated location. At this designated location, a properly shaped and sized contact can be used to contact all of the corresponding traces simultaneously, allowing parallel burn-in of all devices on the substrate to be performed. The devices can still be tested individually after burn-in. Once functionality of the overall subsystem has been confirmed and encapsulation completed, a permanent contact can be made at the designated location to all traces simultaneously so that the devices will be in parallel, and the substrate can be encapsulated to form a completed subsystem.

26 Claims, 2 Drawing Sheets

MODULE WITH LEADS FROM MULTIPLE CHIPS SHORTED TOGETHER ONLY AT EDGE CONTACT LOCATIONS

This is a division of application Ser. No. 07/761,372, filed Sep. 18, 1991.

BACKGROUND OF THE INVENTION

1. Field of the Invention

The present invention relates generally to electronic devices, and more specifically to fabrication of system subassemblies such as memory boards and memory modules.

2. Description of the Prior Art

Assembly and test of computer subsystems, such as memory modules and subsystems, can add a significant percentage to the cost of completed computers. It is important to complete the assembly and testing of subassemblies in a cost efficient manner in order to keep production prices for the subassemblies low enough for them to be sold at competitive prices.

With some systems, the integrated circuit devices which are used are not guaranteed to have a 100% incoming functionality. For example, it has been proposed to provide personal computer memory subsystems which are designed to use memory chips which are partially nonfunctional, and use error detection and correction circuitry to compensate for chip defects. An example of such a proposed subsystem is described in detail in co-pending patent application Ser. No. 07/722,937 titled MEMORY SUBSYSTEM.

It is known that integrated circuits generally tend to have a high percentage of failures very early in the lifetime of the devices. This phenomena is often referred to as infant mortality. Since a significant percentage of parts fail in a short period of time, it is common to subject integrated circuit devices to relatively severe operating conditions for a short period of time in order to force these infant mortality failures to occur. This process is often referred to as burn-in. Proper burn-in tends to be somewhat expensive because of the large number of test fixtures required, but can virtually eliminate failures of integrated circuit devices within the first few years of their operating lifetime. Parts which survive burn-in tend to function for a significant fraction of their expected device lifetime.

In the case of partially nonfunctional devices, such as the memory devices described above, the integrated circuit chips generally have not been subjected to burn-in. These chips were generally rejected at the wafer probe stage. Therefore, a system which makes use of such devices is preferably subjected to burn-in test procedures in order to find and remove devices easily subject to complete failure.

It would be desirable to provide a technique which helps minimize the overall assembly and test time and expense for subsystem assembly and burn-in. Such a system preferably provides a relatively high degree of parallelization during burn-in, and the ability to individually test the integrated circuit devices.

SUMMARY OF THE INVENTION

Therefore, according to the present invention, a plurality of integrated circuit devices are bonded to a substrate. Signal traces for corresponding pins of the devices are run to the same location, but are not electrically connected. They are, however, located in close physical proximity at a designated location. At this designated location, a properly shaped and sized contact can be used to contact all of the corresponding traces simultaneously, allowing parallel burn-in of all devices on the substrate to be performed. The devices can still be tested individually after burn-in. Once functionality of the overall subsystem has been confirmed and encapsulation completed, a permanent contact can be made at the designated location to all traces simultaneously so that the devices will be in parallel, and the substrate can be encapsulated to form a completed subsystem.

BRIEF DESCRIPTION OF THE DRAWINGS

The novel features believed characteristic of the invention are set forth in the appended claims. The invention itself however, as well as a preferred mode of use, and further objects and advantages thereof, will best be understood by reference to the following detailed description of an illustrative embodiment when read in conjunction with the accompanying drawings, wherein:

DESCRIPTION OF THE PREFERRED EMBODIMENT

Figure 1:
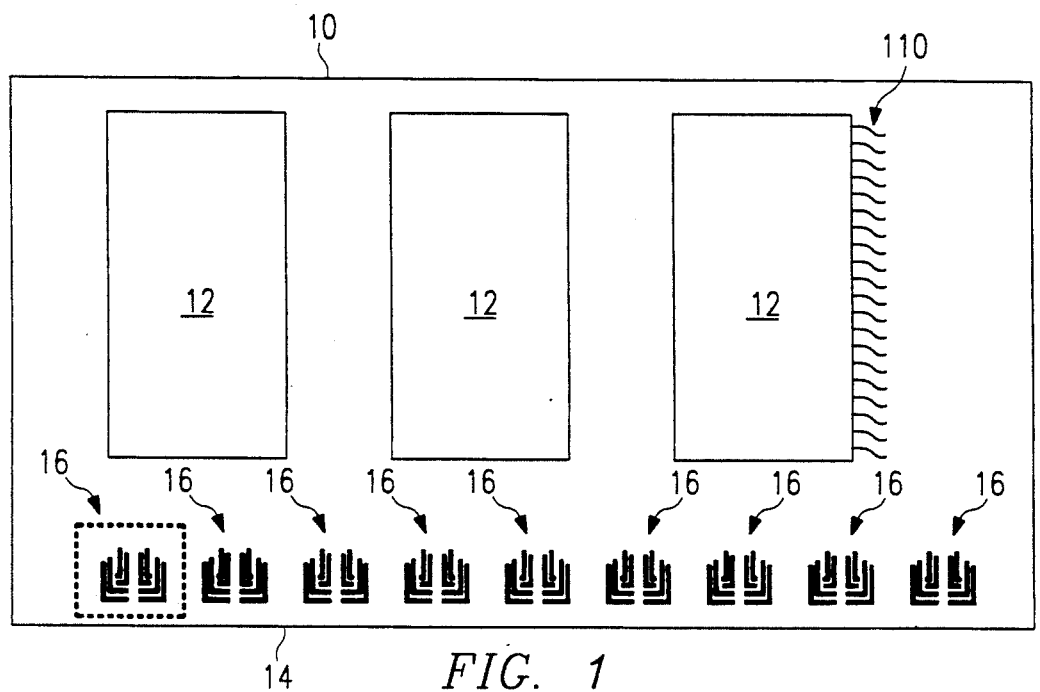
FIG. 1 is a partial view of a portion of a single sided in-line memory module (SIMM)

Referring to FIG. 1, a portion of a substrate 10 is shown. The substrate 10 is a nonconductive material to which unpackaged integrated circuit chips can be bonded. Conductive traces (not shown) are used to conduct signals across the substrate 10 as known in the art. Materials which can be used for the substrate 10 include alumina, BeO, aluminum nitride, and various soft substrate materials including PC board material.

Unpackaged integrated circuit devices 12 are connected to the substrate. 10 as known in the art. Various types of epoxy resins and other materials can be used to attach the devices 12 to the substrate 10. Electronic connection is made between the leads 110 of the devices 12 and conductive signal traces (not shown) on the substrate 10 using known techniques. For example, thermocompression, thermosonic, wedge or ball bonding techniques, T.A.B. or flip-chip techniques, may be used.

In the preferred embodiment, the integrated circuit devices 12 are dynamic random access memory (DRAM) devices, and the substrate 10 provides a framework for a single in-line memory module (SIMM) as known in the art. The signal traces to the corresponding pins of the memory devices 12 must be connected in parallel for the SIMM to function.

Typically, a SIMM will contain eight or more memory devices 12 on each substrate 10. The conductive signal traces are brought to one edge 14 of the substrate 10. At this point, connectors are attached to make electrical contact to memory subsystem cards.

In the drawing of FIG. 1, it is assumed that eight integrated circuit devices 12 are mounted on the substrate 10. Thus, for each corresponding pin of the integrated circuit devices 12, eight individual traces must be connected to an electrically common point and brought to a location near the edge 14 of the substrate 10. Nine of such common locations 16 are shown in FIG. 1.

Figure 2:
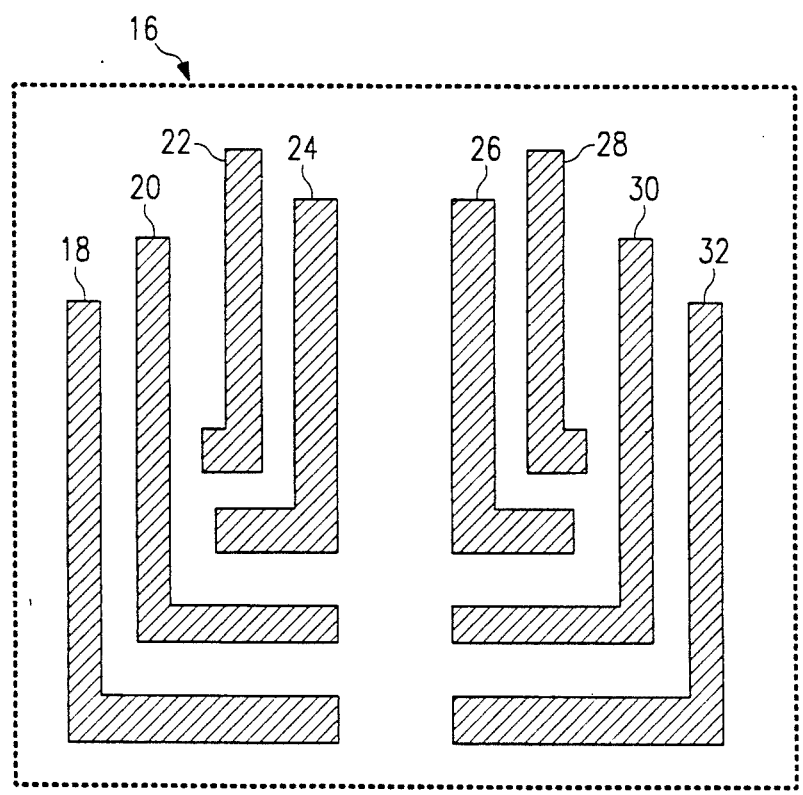
FIG. 2 an enlargement of a portion of the module of FIG. 1.

FIG. 2 shows an enlargement of one of the common locations 16 shown in FIG. 1. Eight conductive traces 18-32 terminate within the common location 16. The conductive traces 18-32 do not make physical or electrical contact, but are located in close physical proximity for reasons which will be described in connection with FIG. 3. In FIG. 2, traces 18-24 form a pattern which is mirrored by traces 26 through 32. However, other patterns may be used. If the SIMM contains more or less than eight memory devices, there will be a greater or lesser number of conductive traces 18-32.

Figure 3:
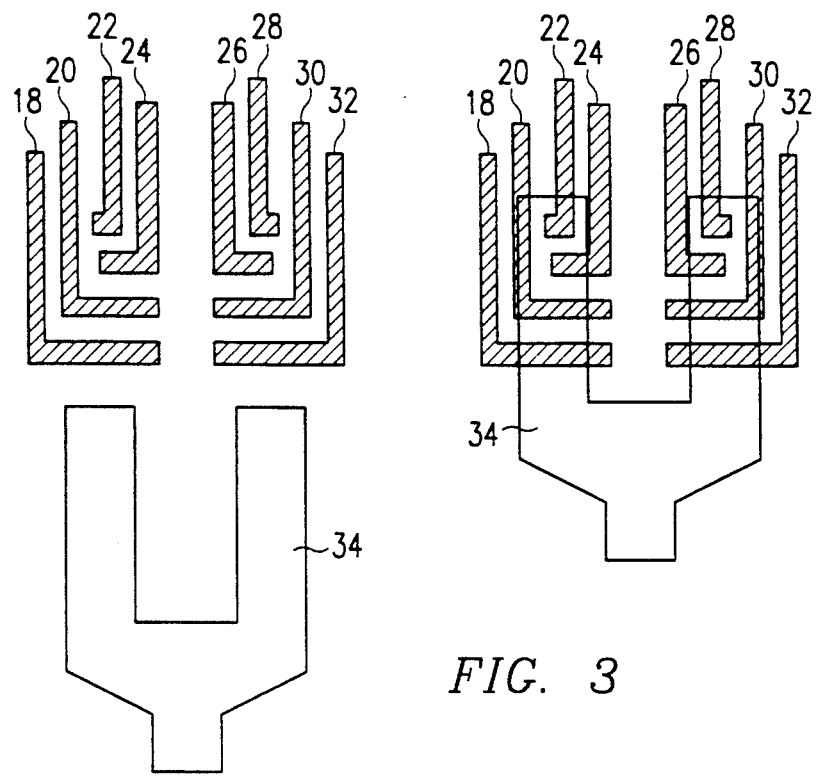
FIG. 3 is an enlargement of a portion of the module of FIG. 1 showing contact of individual traces simultaneously by a single electrical conductor.

FIG. 3 illustrates a connector 34 which can be used to simultaneously contact all of the conductive traces 18-32. A test socket having multiple connectors 34 can be used to burn-in the devices 12 in the SIMM. Power can be applied to all of the devices 12 simultaneously through the appropriate connector 34, and various other input signals may be provided simultaneously to all of the devices 12 during burn-in if desired.

Once burn-in has been completed, removing the connector 34 as shown on the left hand side of FIG. 3 serves to isolate the traces 18-32 to each of the devices 12. This allows each device to be tested individually for functionality by probing the corresponding trace 18-32. A probe head having one probe corresponding to each common location 16 can be positioned to make contact with all of the traces going to a single device. Moving the probe head allows for testing of the next device 12.

If one or more of the devices 12 are determined to be non-functional or have other problems preventing their use in the SIMM, the selected devices 12 can be removed from the substrate 10. Replacement devices can then be substituted and then bonded to the substrate 10 as described above. The substitute devices may be ones which have already been subjected to burn-in, or the entire substrate 10 can be subjected to the burn-in process again.

Figure 4:
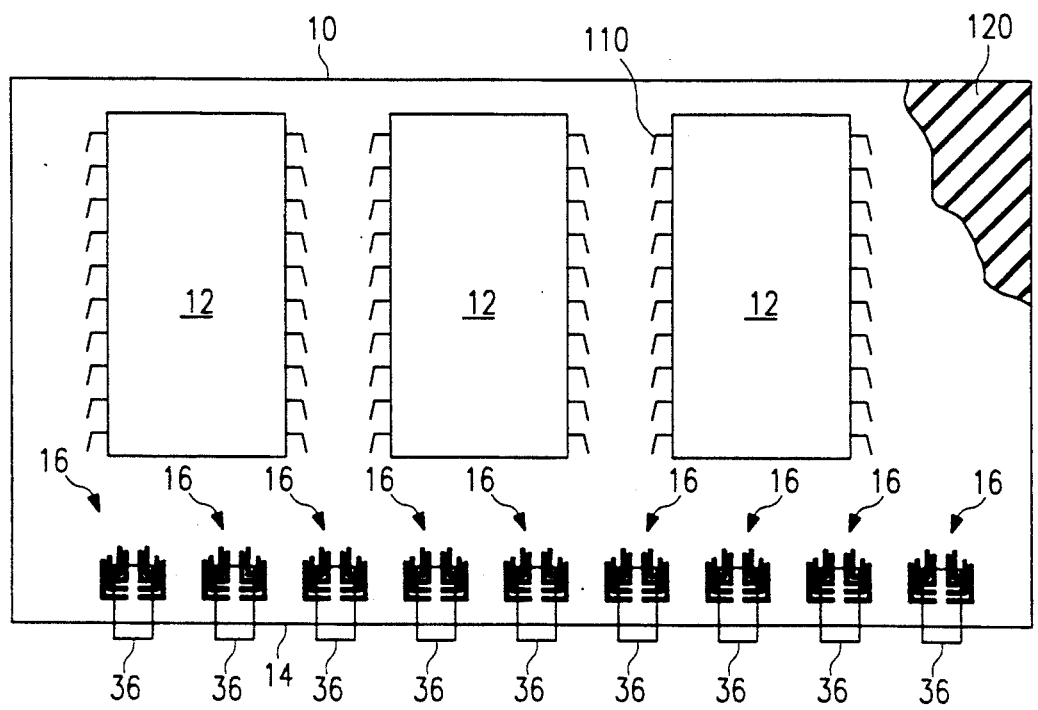
FIG. 4 is a view of a portion of a SIMM with permanent conductive leads attached.

Once all of the devices 12 have been verified as operating within the desired parameters, permanent connectors can be attached to the common locations 16. FIG. 4 illustrates a SIMM on which permanent connectors 36 have been attached. Rectangular connectors 36 may be used as shown in FIG. 4, or connectors shaped the same as connectors 34 may be used if desired. Typically, the permanently attached connectors 36 will be soldered to the desired location 16, and the solder will short together all of the conductive traces 18-32 at that location 16. The connectors 36 are preferably suitable for insertion into a socket or PC board as known in the art.

After attachment of the permanent connectors 36, a protective coating 120 is then formed over the die and interconnect bond locations, and the SIMM memory module is complete. The permanent coating should be applied before any soldering operations, so the connectors 36 may need to be attached after the coating is formed. Substrate 10 was used to hold the unpackaged integrated circuit dice 12 for testing, and also serves as the major support for the completed module. Thus, no additional test fixtures are required for burn-in and testing of the integrated circuit devices 12.

Subsystems fabricated using the techniques described above have a number of advantages over separately burning-in and testing integrated circuit devices. They are simple, in that the test substrate 10 is also incorporated into the final product. Assembly and testing of the SIMMs is relatively inexpensive, since there are no materials dedicated to burn-in and testing which must be discarded after assembly. When memory subsystems use partial memories, as described in co-pending patent application Ser. No. 07/722,937, more extensive burn-in and testing is often required than is the case when parts having 100% functionality are used. Thus, the burn-in and test procedure is more important to the overall functionality of the memory subsystem. The techniques described above provide a relatively simple method for assembling and testing SIMMs for memory modules which is relatively inexpensive.

While the invention has been particularly shown and described with reference to a preferred embodiment, it will be understood by those skilled in the art that various changes in form and detail may be made therein without departing from the spirit and scope of the invention.

What is claimed is:

1. An electronic device, comprising:
   a non-conductive substrate;
   a plurality of integrated circuit devices attached to said substrate, each of said integrated circuit devices having a plurality of leads;
   a plurality of conductive traces on said substrate and operatively connected to said integrated circuit leads, said traces connected to corresponding integrated circuit leads terminating in designated locations; and
   a plurality of conductive means attached to said substrate, each of said conductive means electrically connecting all of said traces terminating in each designated location;
   wherein said conductive means are the only connectors operatively connecting the corresponding conductive traces in parallel, whereby the corresponding conductive traces are isolated when said conductive means are removed.

2. The device of claim 1, wherein said integrated circuit devices comprise memory devices.

3. The device of claim 1, wherein said integrated circuit devices are removably attached to said substrate.

4. The device of claim 1, further comprising a protective coating covering said integrated circuit devices and said substrate.

5. The device of claim 1, wherein said substrate comprises epoxy resin bonding material beneath each said integrated circuit device.

6. The device of claim 1, comprising at least eight said integrated circuit devices.

7. The device of claim 1, wherein said integrated circuit devices are DRAMs.

8. The device of claim 1, wherein said substrate and said conductive means have the geometry of a predetermined connector format.

9. The device of claim 1, wherein, at each said designated location, said conductive means is soldered to all of said integrated circuit leads which terminate at said respective designated location.

10. The device of claim 2, wherein said substrate is formed from a material selected from the group consisting of BeO, alumina, and aluminum nitride.

11. The device of claim 2, wherein said substrate and said conductive means provide a SIMM connector format.

12. The device of claim 2, wherein all of said designated locations are positioned along a single edge of said substrate.

13. A circuit board, comprising;

a non-conductive substrate suitable for attaching integrated circuit devices thereto; and a plurality of conductive traces on said substrate, wherein said conductive traces operatively connect position for attaching leads from the integrated circuit devices to designated locations on said substrate, and wherein traces terminating in each designated location terminate in close physical proximity, and the ones of said traces terminating in each said designated location are not electrically operatively connected together except at said respective designated location.

14. The board of claim 13, wherein all of said designated locations are positioned along a single edge of said substrate.

15. The board of claim 13, wherein said substrate and said conductive means have the geometry of a predetermined connector format.

16. The board of claim 13, wherein said substrate is formed from a material selected from the group consisting of BeO, alumina, and aluminum nitride.

17. The board of claim 13, wherein said substrate and said conductive means provide a SIMM connector format.

18. An electronic module, comprising:

a non-conductive substrate;

a plurality of integrated circuit devices attached to said substrate, each of said integrated circuit devices having a plurality of leads;

a plurality of conductive traces on said substrate and operatively connected to said integrated circuit leads, said traces connected to corresponding integrated circuit leads terminating in designated locations; and a plurality of conductive means attached to said substrate, each of said conductive means electrically connecting all of said traces terminating in each designated location;

wherein said conductive means are the only connectors operatively connecting the corresponding conductive traces in parallel, whereby the corresponding conductive traces are isolated when said conductive means are removed.

19. The module of claim 18, wherein said substrate and said conductive means have the geometry of a predetermined connector format.

20. The module of claim 18, wherein all of said designated locations are positioned along a single edge of said substrate.

21. The module of claim 18, wherein said substrate is formed from a material selected from the group consisting of BeO, alumina, and aluminum nitride.

22. The module of claim 18, wherein said substrate and said conductive means provide a SIMM connector format.

23. The module of claim 18, wherein said substrate comprises epoxy resin bonding material beneath each said integrated circuit device.

24. The module of claim 18, comprising at least eight said integrated circuit devices.

25. The module of claim 18, wherein said integrated circuit devices are DRAMs.

26. The module of claim 18, wherein, at each said designated location, said conductive means is soldered to all of said integrated circuit leads which terminate at said respective designated location.

* * * * *